Aug. 5, 1969 R. H. FICHTNER 3,460,048

MULTISTAGE DIRECT COUPLED TRANSISTOR AMPLIFIERS EMPLOYING FEEDBACK

Filed Feb. 7, 1966

INVENTOR.
ROLAND H. FICHTNER

BY [signature]

PATENT AGENT

United States Patent Office 3,460,048
Patented Aug. 5, 1969

3,460,048

MULTISTAGE DIRECT COUPLED TRANSISTOR AMPLIFIERS EMPLOYING FEEDBACK

Roland H. Fichtner, Waterloo, Ontario, Canada, assignor to Electrohome Limited, Ontario, Canada Filed Feb. 7, 1966, Ser. No. 525,489
Int. Cl. H03g *3/30;* H03f *1/38*
U.S. Cl. 330—25 10 Claims

ABSTRACT OF THE DISCLOSURE

A multistage, direct-coupled, transistor amplifier has two separate networks both for negative AC and DC feedback. Where the number of transistors is odd and at least three, one network is connected between the emitters of the first and last transistors, while the other network is connected between the collector and base of the last and first transistors respectively. Where the number of transistors is even, one network is connected between the emitter and base of the last and first transistors respectively, while the other is connected between the collector and emitter electrodes of the last and first transistors respectively.

This invention relates to multistage, direct-coupled, transistor amplifiers having two separate networks both for negative AC and DC feedback.

It has been common practice to provide an amplifier with a feedback network to linearize the amplifier and stabilize the DC operating conditions. Current feedback networks and voltage feedback networks have been used.

In accordance with this invention, two separate networks both for negative AC and DC feedback are employed in a multistage, direct-coupled transistor amplifier. The result is not merely the linearization and DC stabilization of the amplifier, but the provision of an amplifier capable of practical use with signal sources having output impedances varying over a wide range.

This invention may be embodied in multistage, direct-coupled amplifiers having an even number or an odd number of transistors. In the former case, one feedback network is connected between the emitter electrode of the output stage transistor and the base electrode of the input stage transistor. The other feedback network is connected between the collector electrode of the output stage transistor and the emitter electrode of the input stage transistor. In the latter case, one feedback network is connected between the emitter electrode of the output stage transistor and the emitter electrode of the input stage transistor, while the other feedback network is connected between the collector electrode of the former transistor and the base electrode of the latter one.

Figure 1:
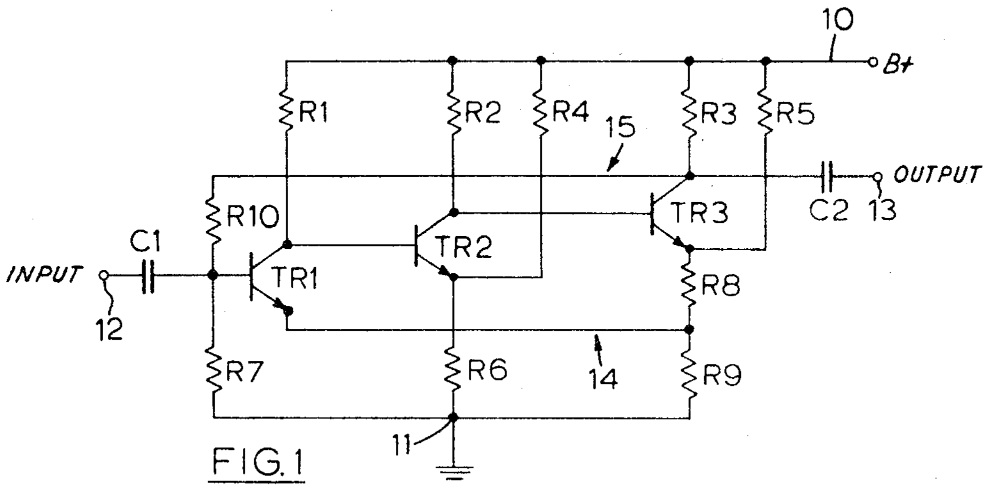
Figure 2:
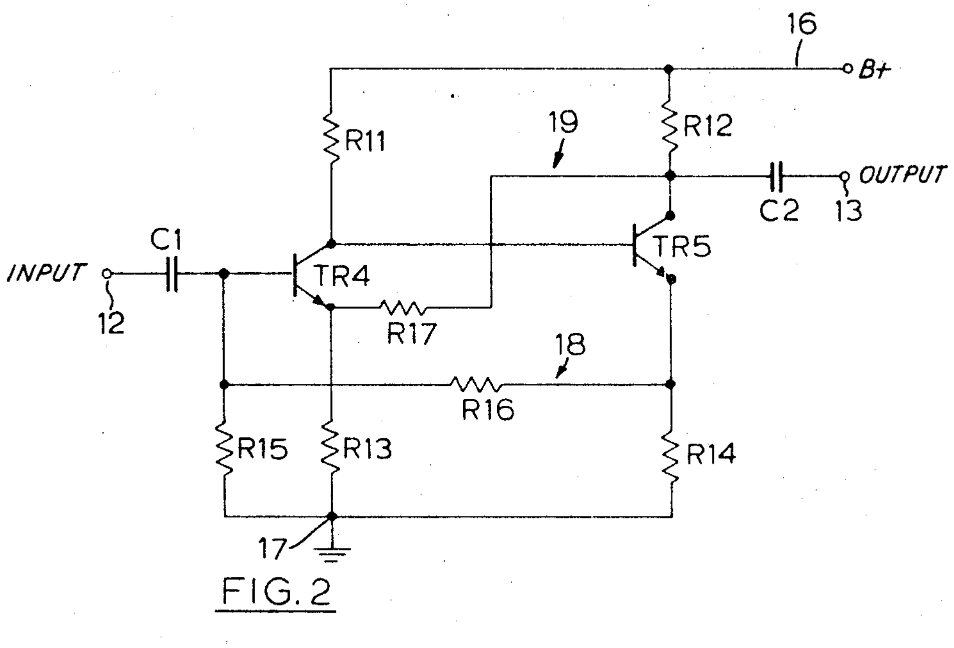

This invention will become more apparent from the following detailed description, taken in conjunction with the appended drawings, in which:

FIGURES 1 and 2 are circuit diagrams of three and two stage amplifiers respectively embodying this invention.

Referring to FIGURE 1, there is shown a three stage, direct-coupled amplifier employing a transistor TR1 in the input stage, a transistor TR2 in the intermediate stage, and a transistor TR3 in the output stage. While only one intermediate stage has been shown, it should be appreciated that any odd number of intermediate stages all of the same type as the intermediate stage illustrated may be employed without departing from this invention. All of transistors TR1, TR2 and TR3 are of the same conauctivity type and are illustrated as being NPN transistors. However, all of these transistors may be PNP transistors if a suitable reversal of the polarity of the biasing source is employed. The base electrode of transistor TR2 is direct-coupled to the collector electrode of the immediately preceding transistor TR1, while the base electrode of transistor TR3 also is direct-coupled to the collector electrode of the immediately preceding transistor, TR2. If an odd number of intermediate stages are employed, the base electrode of each of the transistors in the intermediate stage similarly will be direct-coupled to the collector electrode of the immediately preceding one of the transistors.

A source of DC potential (B+) is connected to conductor 10 and via this conductor and load resistors R1, R2 and R3 to the collector electrodes of transistors TR1, TR2 and TR3 respectively. Biasing resistors R4 and R5 are connected between B+ and the emitter electrodes of transistors TR2 and TR3. A resistor R6 is connected between the emitter electrode of transistor TR2 and a terminal 11 which is maintained at a DC potential different from B+, in the present instance, ground potential.

A resistor R7 is connected between the base electrode of transistor TR1 and terminal 11. A series circuit consisting of resistors R8 and R9 is connected between the emitter electrode of transistor TR3 and terminal 11.

An input terminal 12 is coupled via a capacitor C1 to the base electrode of transistor TR1 to enable input signals to be amplified by the amplifier to be applied to transistor TR1. An output terminal 13 is coupled via a blocking capacitor C2 to the collector electrode of transistor TR3. The output signal of the amplified may be derived at output terminal 13.

A first AC and DC feedback network generally designated by the reference numeral 14 is connected between the emitter electrodes of the input and output stage transistors TR1 and TR3 respectively. This feedback network includes resistor R8. A second AC and DC feedback network generally designated by the reference numeral 15 is connected between the collector electrode of the output stage transistor TR3 and the base electrode of the input stage transistor TR1. This AC and DC feedback network 15 includes a resistor R10.

Referring now to FIGURE 2, there is shown a two-stage, direct-coupled amplifier employing a transistor TR4 in the input stage and a transistor TR5 in the output stage. Both transistors TR4 and TR5 are illustrated as being NPN transistors, but, as in the case of FIGURE 1, as long as all of the transistors of the amplifier are of the same conductivity type, they could be either all NPN transistors or PNP transistors. The base electrode of transistor TR5 is direct-coupled to the collector electrode of transistor TR4. While no intermediate stages have been shown in the amplifier of FIGURE 2, it should be appreciated that an even number of intermediate stages may be employed, these stages being connected together and to transistors TR4 and TR5 in the same manner that transistor TR4 is shown as connected to transistor TR5.

A source of DC potential (B+) is connected to a conductor 16 which, in turn, is connected via load resistors R11 and R12 to the collector electrodes of transistors TR4 and TR5. Connected between the emitter electrodes of these transistors and a terminal 17 maintained at a DC potential different from B+, in this case, ground potential, are resistors R13 and R14. Input and output terminals 12 and 13 and capacitors C1 and C2 are provided and connected in the same manner as in FIGURE 1. A resistor R15 is connected between the base electrode of transistor TR4 and terminal 17.

A first AC and DC feedback network designated by reference numeral 18 and including a resistor R16 is connected between the emitter electrode of output stage transistor TR5 and the base electrode of input stage transistor TR4. A second AC and DC feedback network 19, which includes a resistor R17, is connected between the collector electrode of output stage transistor TR5 and the emitter electrode of input stage transistor TR4.

The operation of the two-stage, direct-coupled transistor amplifier shown in FIGURE 2 now will be discussed. In this regard, it will be assumed that there is an undesired increase in the collector current of transistor TR5. This may be due, for example, to an increase in temperature. When the collector current of transistor TR5 increases or decreases, it is desired to maintain the collector and emitter voltages of this output stage transistor constant.

An increase in the collector current of the output stage transistor will cause a decrease of the collector voltage of this transistor and an increase in the emitter voltage of transistor TR5. A decrease of the collector voltage of transistor TR5 will cause a decrease in the emitter voltage of transistor TR4 because of feedback network 19. Similarly, because of feedback network 18, an increase in the emitter voltage of transistor TR5 will cause an increase in the base voltage of transistor TR4. When these changes occur, an increase in the collector current of transistor TR4 and a decrease in its collector voltage will result. However, a decrease in the collector voltage of transistor TR4 causes a decrease in the collector current of transistor TR5 and a consequent increase in the collector voltage of transistor TR5 and a decrease in the emitter voltage thereof to compensate for the previous decrease of the collector voltage of transistor TR5 and increase of the emitter voltage thereof caused by the original increase in the collector current of transistor TR5.

In a similar manner any decrease in the collector current of transistor TR5 will result in a subsequent increase in this collector current to compensate for the original change.

It should be noted, of course, that the foregoing explanation assumes operating conditions such that the emitter current of transistor TR4 is considerably less, by a factor of say five to ten, than the current feedback to this emitter electrode via feedback network 19, and similarly that the base current of transistor TR4 is less by a factor of five to ten or more than the current feedback to the base electrode of transistor TR4 via feedback network 18.

Taking into consideration the explanation of the operation of the circuit of FIGURE 2, those skilled in the art will readily appreciate the operation of the circuit illustrated in FIGURE 1.

The effect of the two AC and DC feedback networks is not only to stabilize the DC operating conditions and linearize the amplifier so that over its operating range the output voltage derived at output terminal 13 is substantially equal to a constant multiplied by the input voltage applied to input terminal 12, but also to provide an amplifier that is capable of practical operation with input signal sources having output impedances that vary over a wide range. If the impedance of the signal source is high, voltage feedback will be the most effective, while current feedback will be most effective if the impedance of the signal source is low. With signal sources having impedances in a range between low and high values, both types of feedback will be effective.

While preferred embodiments of this invention have been disclosed herein, those skilled in the art will appreciate that changes and modifications may be made therein without departing from the spirit and scope of this invention as defined in the appended claims.

The embodiments of the invention in which an exclusive property or privilege is claimed are defined as follows:

1. A multi-stage, direct-coupled, transistor amplifier having two separate networks both for negative AC and DC feedback, said amplifier comprising an odd number of and at least three transistors all of the same conductivity type and each having base, collector and emitter electrodes; means directly coupling said base electrode of each of said transistors and said collector electrode of the immediately preceding one of said transistors of said amplifier; means coupled to said base electrode of the first of said transistors for supplying an input signal to be amplified thereto; means coupled to said collector electrode of the last of said transistors for deriving an output signal from said amplifier; a first AC and DC negative feedback network connected between said emitter electrodes of said first and last transistors and bypassing each transistor intermediate said first and last transistors; and a second AC and DC negative feedback network connected between said collector electrode of said last transistor and said base electrode of said first transistor.

2. An amplifier according to claim 1 wherein said first feedback network comprises a first resistor connected between said emitter electrodes of said first and last transistors, and wherein said second feedback network comprises a second resistor connected between said collector electrode of said last transistor and said base electrode of said first transistor.

3. An amplifier according to claim 2 including a source of DC potential; a terminal at a DC potential different from the potential of said source; third resistors connected between said source and said collector electrodes of said transistors; fourth resistors connected between said source and said emitter electrodes of all but said first transistor; a fifth resistor connected between said base electrode of said first transistor and said terminal; sixth resistors connected between said terminal and said emitter electrodes of said transistors intermediate said first and last transistors; and a seventh resistor connected in series circuit with said first resistor, said series circuit being connected between said terminal and said emitter elecrode of said last transistor.

4. An amplifier according to claim 3 wherein said transistors are NPN transistors, and wherein the DC potential of said source is positive relative to said DC potential of said terminal.

5. An amplifier according to claim 4 wherein there are three of said transistors.

6. A multistage, direct-coupled, transistor amplifier having two separate networks both for negative AC and DC feedback, said amplifier comprising an even number of transistors all of the same conductivity type and each having base, collector and emitter electrodes; means directly coupling said base electrode of each of said transistors and said collector electrode of the immediately preceding one of said transistors of said amplifier for passing a signal amplified by a preceding one of said transistors to the base electrode of the next one of said transistors; means coupled to said base electrode of the first of said transistors for supplying an input signal to be amplified thereto; means coupled to said collector electrode of the last of said transistors for deriving an output signal from said amplifier; a first AC and DC negative feedback network connected between said emitter electrode of said last transistor and said base electrode of said first transistor; and a second AC and DC negative feedback network connected between said collector electrode of said last transistor and said emitter electrode of said first transistor.

7. An amplifier according to claim 6 wherein said first feedback network comprises a first resistor connected between said emitter electrode of said last transistor and said base electrode of said first transistor, and wherein said second feedback network comprises a second resistor connected between said collector electrode of said last transistor and said emitter electrode of said first transistor.

8. An amplifier according to claim 7 including a source of DC potential; a terminal at a DC potential different from the potential of said source; third resistors connected between said source and said collector electrodes of said transistors; a fourth resistor connected between said base electrode of said first transistor and said terminal; and fifth resistors connected between said terminal and said emitter electrodes of said transistors.

9. An amplifier according to claim 8 wherein said transistors are NPN transistors and wherein the DC potential of said source is positive relative to said DC potential of said terminal.

10. An amplifier according to claim 9 wherein there are two of said transistors.

References Cited

UNITED STATES PATENTS

| | | | |
|---|---|---|---|
| 3,373,368 | 3/1968 | Gewirtz | 330—28 X |
| 2,901,556 | 8/1959 | Chapman et al. | 330—28 X |
| 3,096,487 | 7/1963 | Lee | 330—25 X |

ROY LAKE, Primary Examiner

LAWRENCE J. DAHL, Assistant Examiner

U.S. Cl. X.R.

330—26